United States Patent
Faltermeier et al.

(10) Patent No.: US 6,890,815 B2
(45) Date of Patent: May 10, 2005

(54) REDUCED CAP LAYER EROSION FOR BORDERLESS CONTACTS

(75) Inventors: Johnathan Faltermeier, Lagrangeville, NY (US); Jeremy Stephens, Ossining, NY (US); David Dobuzinsky, New Windsor, NY (US); Larry Clevenger, Lagrangeville, NY (US); Munir D. Naeem, Poughkeepsie, NY (US); Chienfan Yu, Highland Mills, NY (US); Larry Nesbit, Williston, VT (US); Rama Divakaruni, Ossining, NY (US); Michael Maldei, Durham, NC (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/655,199

(22) Filed: Sep. 4, 2003

(65) Prior Publication Data

US 2005/0051839 A1 Mar. 10, 2005

(51) Int. Cl.⁷ .......................................... H01L 21/8242
(52) U.S. Cl. ........................................ 438/242; 438/243
(58) Field of Search ................................ 438/242, 243, 438/386, 259, 270

(56) References Cited

U.S. PATENT DOCUMENTS

| 6,339,241 | B1 | * | 1/2002 | Mandelman et al. | ....... | 257/301 |
| 6,660,581 | B1 | * | 12/2003 | Yang et al. | ................. | 438/242 |
| 6,727,541 | B2 | * | 4/2004 | Nishikawa | ................. | 257/301 |

* cited by examiner

*Primary Examiner*—Phat X. Cao
(74) *Attorney, Agent, or Firm*—Slater & Matsil, L.L.P.

(57) ABSTRACT

A method of forming borderless contacts and a borderless contact structure for semiconductor devices. A preferred embodiment comprises using a second etch selectivity material disposed over a first etch selectivity material to preserve the first etch selectivity material during the etch processes for the various material layers of the semiconductor device while forming the borderless contacts.

25 Claims, 12 Drawing Sheets

REDUCED CAP LAYER EROSION FOR BORDERLESS CONTACTS

TECHNICAL FIELD

The present invention relates generally to semiconductor devices, and more particularly to a method of forming borderless contacts and structure thereof.

BACKGROUND

Semiconductors are used in integrated circuits for electronic applications, including radios, televisions, cell phones, and personal computing devices, as examples. Integrated circuits typically include multiple transistors fabricated in single crystal silicon. It is common for there to be millions of integrated circuits or semiconductor devices on a single semiconductor product. One type of semiconductor device is a semiconductor storage device, such as a dynamic random access memory (DRAM), which uses a charge to store information.

Semiconductor devices are fabricated by sequentially depositing, patterning, and doping many insulating, conductive and semiconductor layers. Portions of integrated circuits are often connected to subsequently formed upper layers by forming holes over the circuits and then filling the holes with semiconductor or conductive material to form vias or contacts. The term "contact" used herein refers also to vias.

One method of making contact to an underlying electronic circuit or component region is by forming borderless contacts, as shown in FIGS. 1 and 2. FIG. 1 illustrates a perspective view of a wordline and bitline wiring structure disposed over a memory array such as a DRAM device 100. FIG. 2 shows a cross-sectional view of the DRAM device 100 shown in FIG. 1. Component regions 102 which may comprise DRAM memory cells are formed in a workpiece 120. Wordlines 104 are positioned perpendicular to bitlines 1112, with each intersection of a wordline 104 and bitline 112 being proximate a DRAM memory cell or component region 102 so that the cell can be accessed (e.g., read from or written to). A nitride cap layer 106 is disposed over the top of each wordline 104, and nitride sidewall spacers 108 are formed over the sidewalls of the wordlines 104 and the nitride cap layer 106, as shown. The nitride cap layer 106 and sidewall spacers 108 provide electrical isolation for the wordlines 104 from subsequently formed bitlines 112 and borderless contacts 114.

An insulating material (not shown) is disposed between adjacent bitlines 112 and contacts 114. The insulating material is deposited, and the insulating material is patterned with the bitline 112 and contact 114 pattern. The bitlines 112 and contacts 114 are formed simultaneously in a damascene process as the insulating material is filled with a conductive material. The shape of the contacts 114 is defined by the sidewall spacers 108; thus, the contacts 114 are self-aligned with the underlying component regions 102 which may comprise a source or drain of an access transistor for a DRAM cell, for example. This self-aligning method of making contact to component regions 102 is referred to as a borderless contact 114 technique. Borderless contacts 114 are used often in the manufacturing of memory devices and other semiconductor device applications.

A problem with prior art borderless contact 114 formation methods and structures is that the nitride cap layer 106 can be eroded during the various etch processes, such as a reactive ion etch (RIE) which is often used to manufacture the device. If an excessive amount of the nitride cap layer 106 is eroded away, then shorts can be created between the wordlines 104 and bitlines 112, causing device failures and decreasing yields. For example, the insulating material the bitlines 112 and contacts 114 are formed in typically comprises an oxide. An etch selective to nitride is used to etch the oxide to form the bitline 112 and contact 114 pattern. However, this selective etch process may also etch away a portion or all of the nitride cap layer 106. As semiconductor devices are made smaller, reduced bitline capacitance is required, resulting in thinner insulating layers, further contributing to the nitride cap layer 106 erosion problem.

Thus, what is needed in the art is a method of manufacturing borderless contacts that preserves the nitride cap layer 106.

SUMMARY OF THE INVENTION

These and other problems are generally solved or circumvented, and technical advantages are generally achieved, by preferred embodiments of the present invention, which provide an improved method of manufacturing borderless contacts and structure thereof.

In accordance with a preferred embodiment of the present invention, a method of manufacturing a borderless contact includes providing a workpiece, the workpiece having at least one component region and a first insulating layer formed over the at least one component region, and depositing a first conductive material over the workpiece. A first etch selectivity material is deposited over the first conductive material, a second etch selectivity material is deposited over the first etch selectivity material, and the second etch selectivity material, the first etch selectivity material and the first conductive material are etched to form a plurality of first conductive lines. The second etch selectivity material, first etch selectivity material and first conductive lines include sidewalls, and the second etch selectivity material includes a top surface. The method includes forming sidewall spacers on the sidewalls of the second etch selectivity material, first etch selectivity material and first conductive lines, depositing a liner over exposed portions of the workpiece, the sidewall spacers and the second etch selectivity material top surface, and depositing a second insulating layer over the liner to a height greater than the top surface of the second etch selectivity material. The second insulating layer is patterned with a pattern for a plurality of second conductive lines, the second conductive lines being positioned in a different direction than the first conductive lines, and the liner is removed from at least over the component region. The first insulating layer is removed from over the component region, and a second conductive material is deposited over the second insulating layer to fill the pattern for the plurality of second conductive lines, forming a plurality of second conductive lines and a borderless contact beneath at least one second conductive line abutting the at least one component region.

In accordance with another preferred embodiment of the present invention, a method of manufacturing a semiconductor device includes providing a workpiece, the workpiece having a plurality of component regions and a first insulating layer formed over the component regions, depositing a first conductive material over the workpiece, and depositing a first etch selectivity material over the first conductive material. The method includes depositing a second etch selectivity material over the first etch selectivity material, etching the second etch selectivity material, the first etch selectivity material and the first conductive material to form a plurality of first conductive lines, the second etch selectivity material, first etch selectivity material and first conductive lines comprising sidewalls, the second etch selectivity material comprising a top surface, and depositing a second insulating layer having the same etch selectivity as the first etch selectivity material over the second etch selectivity material and exposed portions of the workpiece. The second insulating layer is anisotropically etched to form sidewall spacers on the sidewalls of the second etch selectivity material, first etch selectivity material and first conductive lines, and a nitride liner is deposited over exposed portions of the workpiece, the sidewall spacers and the second etch selectivity material top surface. A third insulating layer is deposited over the nitride liner to a height greater than the top surface of the second etch selectivity material, and the third insulating layer is patterned with a pattern for a plurality of second conductive lines, the second conductive lines being positioned in a different direction than the first conductive lines. The nitride liner is removed from the component regions, and the first insulating layer is removed from over the component region using an etch process selective to the first etch selectivity material, also removing a portion of the second etch selectivity material. A second conductive material is deposited over the second insulating layer to fill the pattern for the plurality of second conductive lines, forming a plurality of second conductive lines and a borderless contact beneath at least one second conductive line abutting the at least one component region.

In accordance with yet another preferred embodiment of the present invention, a semiconductor device includes a workpiece, the workpiece having at least one component region and a first insulating layer formed over the workpiece. A plurality of first conductive lines are disposed over the workpiece, a first etch selectivity material is disposed over the first conductive lines, and a second etch selectivity material is disposed over the first etch selectivity material. A sidewall spacer is disposed on the sidewalls of the second etch selectivity material, first etch selectivity material and first conductive lines. A second insulating layer is disposed over at least the sidewall spacer, the second insulating layer having a height greater than the top surface of the second etch selectivity material. A plurality of second conductive lines is disposed within the second insulating layer over the first conductive lines, the second conductive lines being positioned in a different direction than the first conductive lines. A borderless contact extends beneath a portion of at least one second conductive line to abut the workpiece component region, the borderless contact abutting a portion of the sidewall spacer.

Advantages of preferred embodiments of the present invention include preserving the first etch selectivity layer during the etch processes to open the various material layers from over the component regions, preventing shorting of the wordlines to subsequently formed bitlines during the formation of the borderless contacts. Embodiments of the present invention result in fewer device failures and improved yields.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor memory device. The invention may also be applied, however, to other semiconductor device applications.

Figure 3:
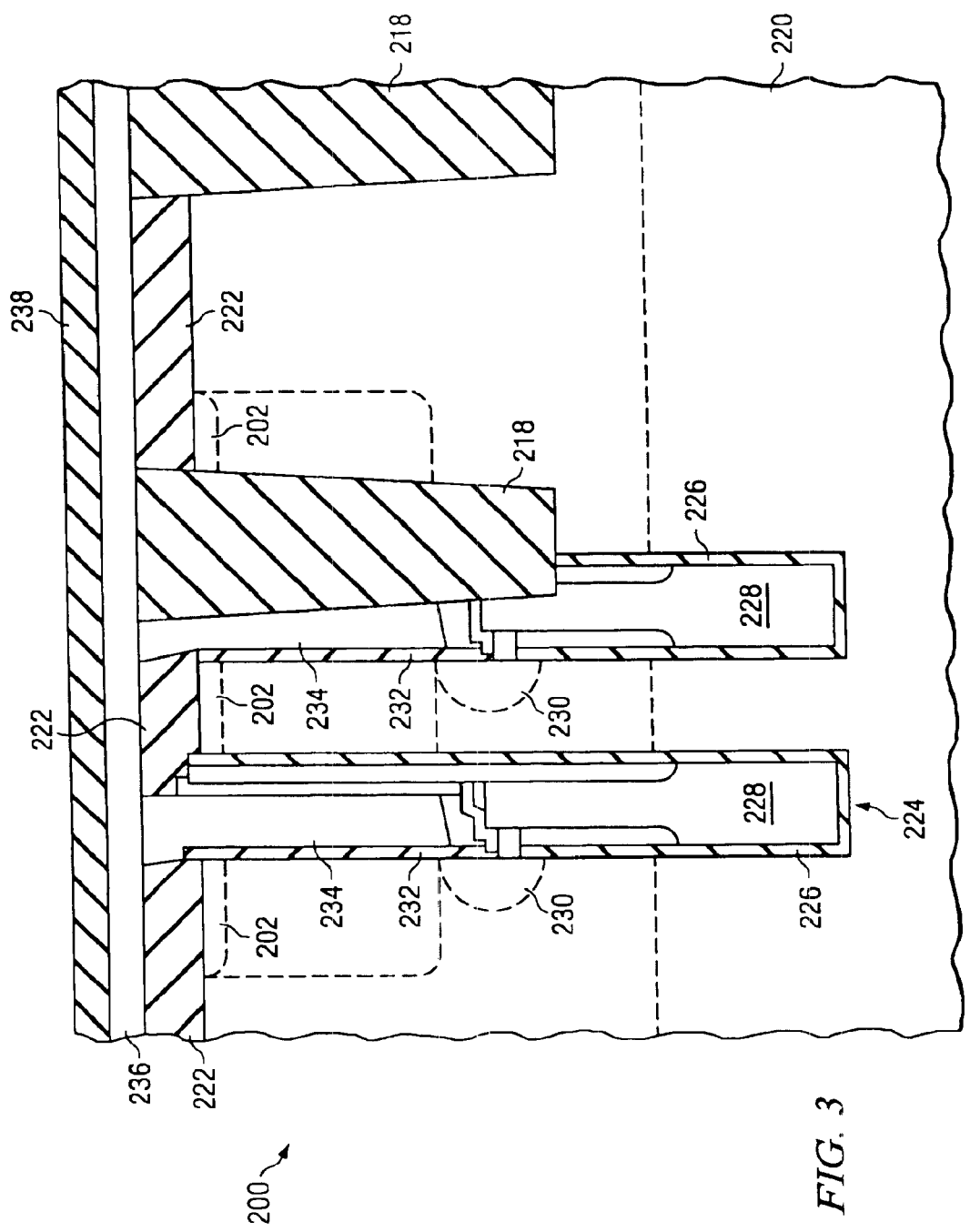
FIGS. 3 through 13 illustrate cross-sectional views of a method of manufacturing borderless contacts in accordance with a preferred embodiment of the present invention.

FIG. 3 shows a cross-sectional view of a semiconductor device 200 that will be manufactured in accordance with a preferred embodiment of the present invention. First, a workpiece 220 is provided. The workpiece 220 preferably comprises a semiconductor wafer, and may include a semiconductor substrate comprising silicon or other semiconductor materials covered by an insulating layer, for example. The workpiece may also include active components or circuits formed in the front end of line (FEOL). The workpiece may comprise silicon oxide over single-crystal silicon, for example. The workpiece may include other conductive layers or other semiconductor elements, e.g. transistors, diodes, etc. Compound semiconductors, GaAs, InP, Si/Ge, or SiC, as examples, may be used in place of silicon. The workpiece 220 preferably comprises component regions 202 formed thereon. Embodiments of the present invention provide a method of forming a borderless contact abutting the component regions 202, to be described further herein.

The workpiece 220 includes an isolation oxide 222 formed at the top portion thereof. The workpiece 220 may include a plurality of deep trenches 224 formed therein, wherein each deep trench 224 includes a capacitor adapted to store a bit of data. The bottom of the deep trenches 224 have been lined with an insulator 226 that functions as a capacitor dielectric, and the deep trenches 224 are filled with a semiconductive material 228 to form one of the plates of the capacitor. A buried strap 230 is formed at a top portion of each deep trench capacitor.

In the drawing shown, the access transistors for the deep trench storage capacitors are positioned vertically. For example, a gate oxide 232 is disposed between a semiconductive material 234, and the component region 202 comprises a source or drain of the access transistor. However, embodiments of the present invention also are useful in memory cells having lateral access transistors. Shallow trench isolation (STI) regions 218 are formed within the workpiece 220 and filled with an insulator such as high density plasma (HDP) oxide, for example. The STI is used to isolate active areas from one another.

A gate conductor material 236 is deposited over the isolation oxide 222 and semiconductive material 234, as shown. The gate conductor material 236 preferably comprises polysilicon and a metal, such as a silicide, deposited in a thickness of about 1000 to 2000 Angstroms, for example. Alternatively, the gate conductive material 236 may comprise other conductive materials such as tungsten, as an example.

A first etch selectivity material 238 is deposited over the gate conductor material 236. The first etch selectivity material 238 preferably comprises silicon nitride, and may alternatively comprise silicon oxycarbide (silicon combined with oxygen, carbon and nitrogen) or other materials, for example. The first etch selectivity material 238 preferably comprises a thickness of about 1000 to 2000 Angstroms, for example.

Figure 4:
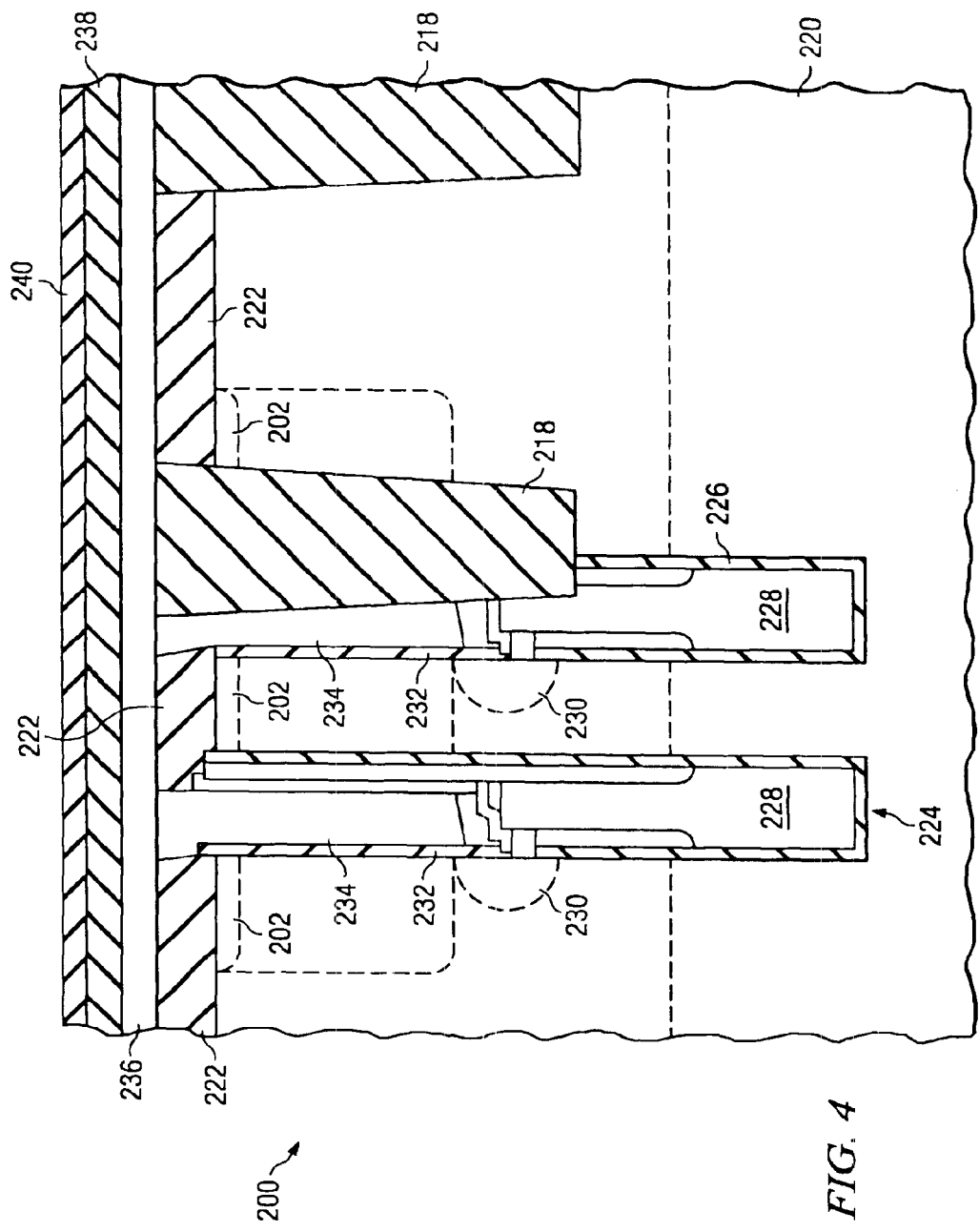

A second etch selectivity material 240 is deposited over the first etch selectivity material 238, as shown in FIG. 4. The second etch selectivity material 240 preferably comprises an oxide such as silicon dioxide, and alternatively the second etch selectivity material 240 may comprise other materials that provide etch selectivity to the first etch selectivity material 238. For example, the second etch selectivity material 240 may alternatively comprise silicon oxycarbide (if the first etch selectivity material 238 does not comprise silicon oxycarbide) or other materials. The second etch selectivity material 240 preferably comprises a thickness of about 250 to 750 Angstroms, for example. The second etch selectivity material 240 may be deposited by chemical vapor deposition (CVD) or physical vapor deposition (PVD), as examples.

Figure 5:
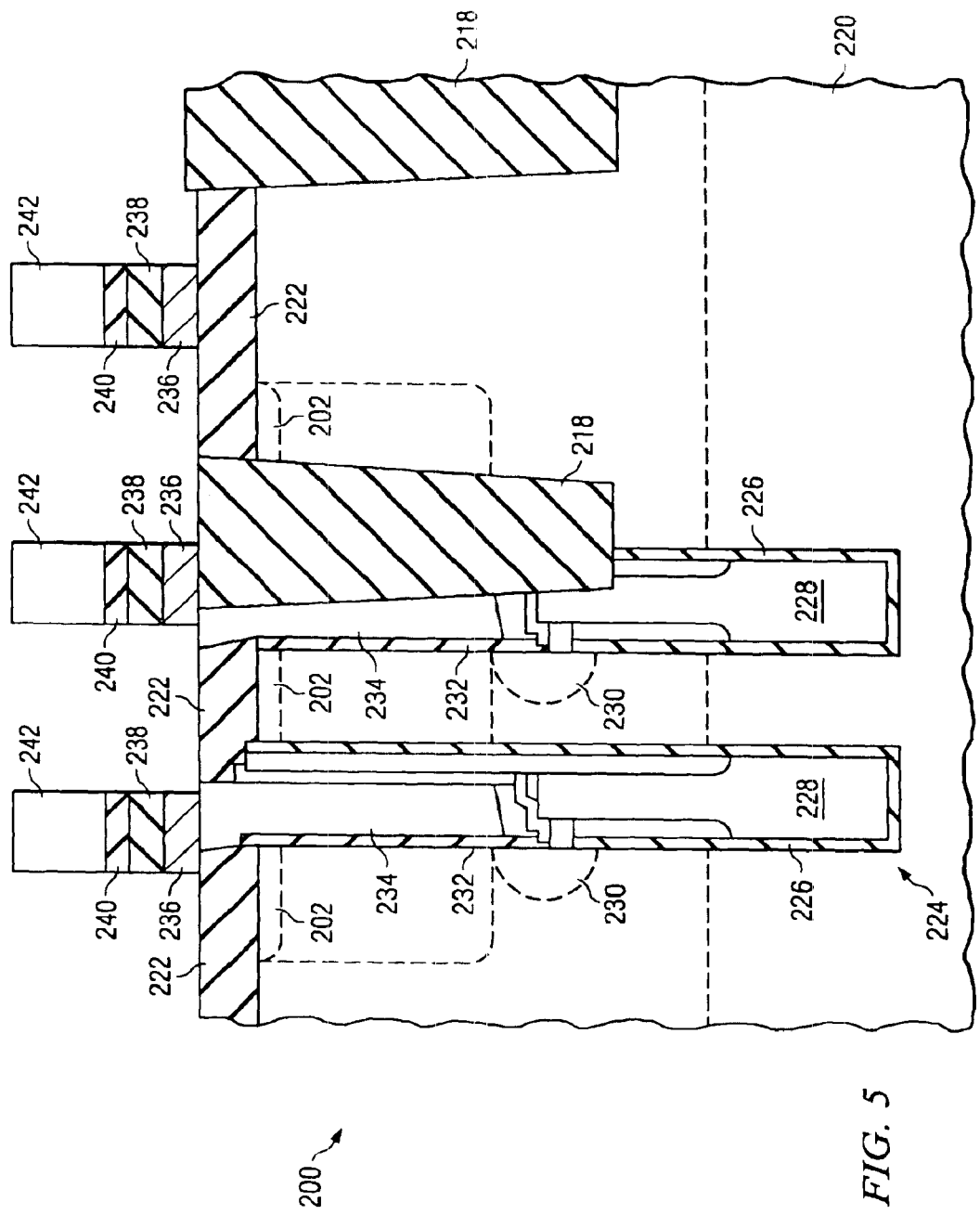

A photoresist 242 is deposited over the second etch selectivity material 240, as shown in FIG. 5. The photoresist 242 is patterned and used as a mask to pattern the underlying second etch selectivity material 240, first etch selectivity material 238, and gate conductor material 236, as shown. The photoresist 242 preferably comprises a thickness of between about 3000 and 5000 Angstroms, for example. With the patterned photoresist 242 left remaining over the top of the second etch selectivity material 240, the workpiece 220 is exposed to a non-selective etch process to etch the second etch selectivity material 240, first selectivity material 238 and gate conductor material 236, forming a plurality of conductive lines which in one embodiment comprise wordlines 236, as shown in FIG. 5. The non-selective etch process may comprise $CF_4$, $CHF_3$, and/or combinations thereof, as an example, although other etch chemistries may alternatively be used.

The first etch selectivity material 238 and second etch selectivity material 240 comprise the same pattern as the wordlines 236 after the etch processes. The first etch selectivity material 238, second etch selectivity material 240 and wordlines 236 comprise sidewalls. The second etch selectivity material 240 has a top surface. The gate conductor material 236 functions as a gate contact for the underlying capacitor, and also as a wordline 236 for the memory cell array. For example, the wordline 236 extends in and out of the paper, and resides over a plurality of memory cells in the row.

Figure 1:
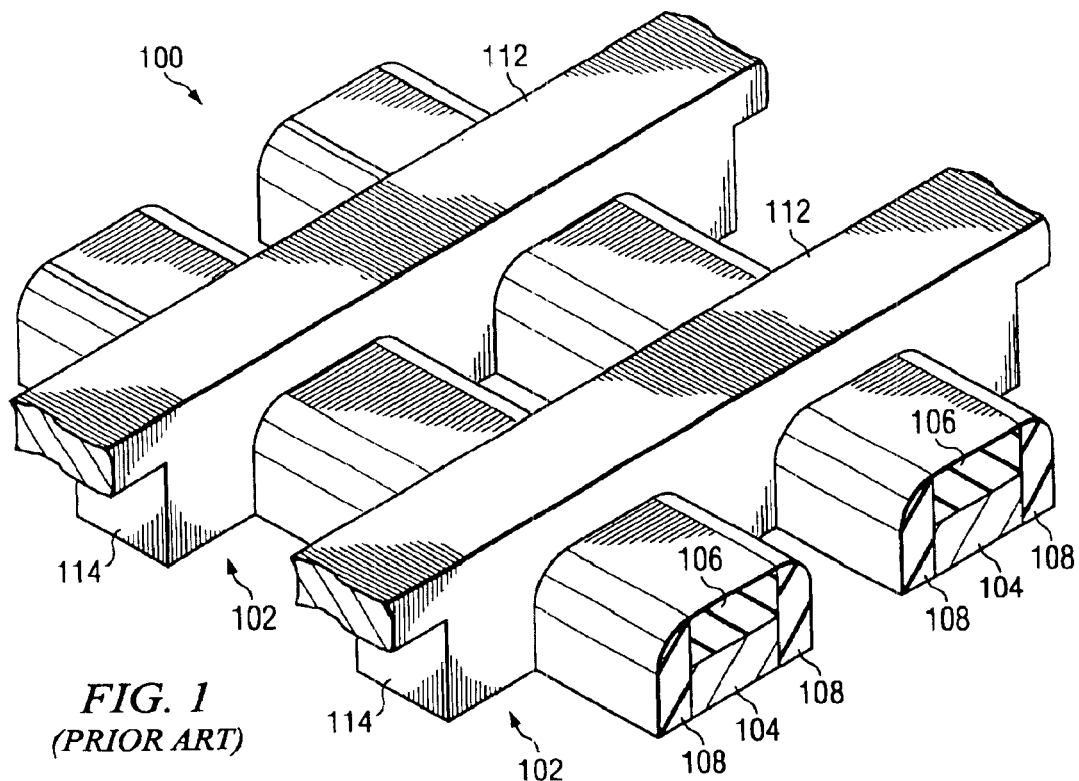
FIG. 1 illustrates a perspective view of a prior art borderless contact structure for a memory device.
Figure 2:
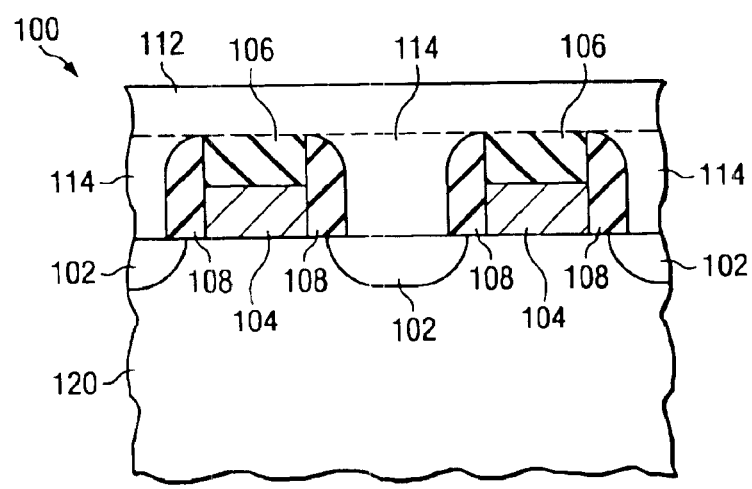
FIG. 2 shows a cross-sectional view of the borderless contacts shown in FIG. 1.

The patterned first etch selectivity material 238 corresponds to the nitride cap layer 106 shown in the prior art structure of FIGS. 1 and 2, for example. In accordance with embodiments of the present invention, it is desired that none of the first etch selectivity material 238 be removed in the subsequent formation of bitlines and borderless contacts, to be discussed further herein.

Figure 6:
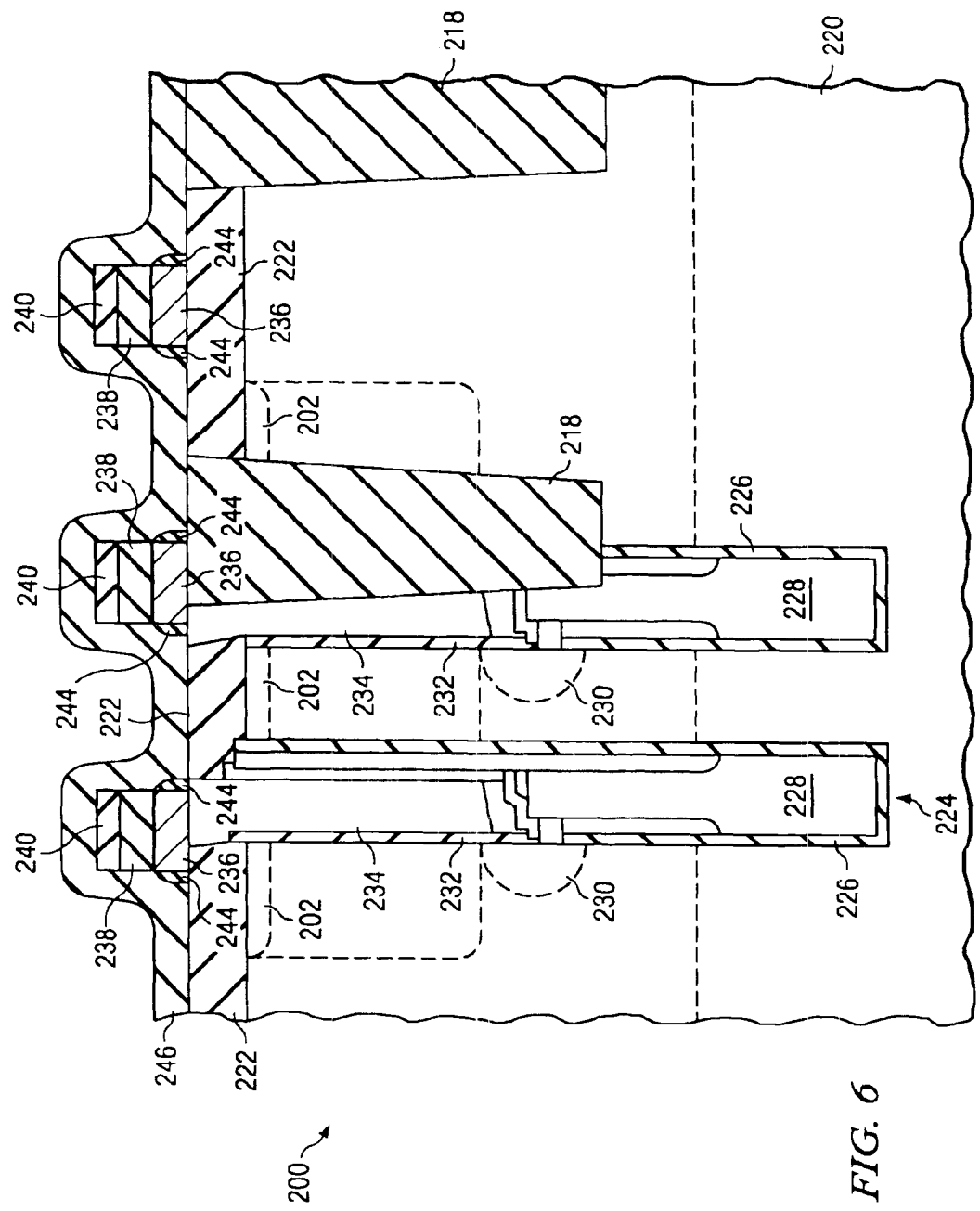

After the gate conductor material 236 is etched, the photoresist 242 is removed, and a thin oxide layer 244 is formed on the sidewalls of the gate conductor material or wordlines 236, as shown in FIG. 6. The thin oxide layer 244 may be formed by exposing the workpiece 220 to oxygen and then heating it, for example. The thin oxide layer 244 preferably comprises a thickness of between about 50 and 150 Angstroms, for example. The thin oxide layer 244 is typically not formed on the sidewalls of the first etch selectivity material 238 and second etch selectivity material 240, for example.

An insulating layer 246 is deposited over the top surface of the workpiece 220 to cover the exposed portions of the isolation oxide 222, the top surface of the second etch selectivity material 240, sidewalls of the first and second etch selectivity materials 238 and 240, and thin oxide layer 244, as shown in FIG. 6. The insulating layer 246 preferably comprises silicon nitride, and alternatively may comprise other materials, as examples. The insulating layer 246 preferably comprises a material with the same etch selectivity as the first etch selectivity material 238 in one embodiment of the present invention.

Figure 7:
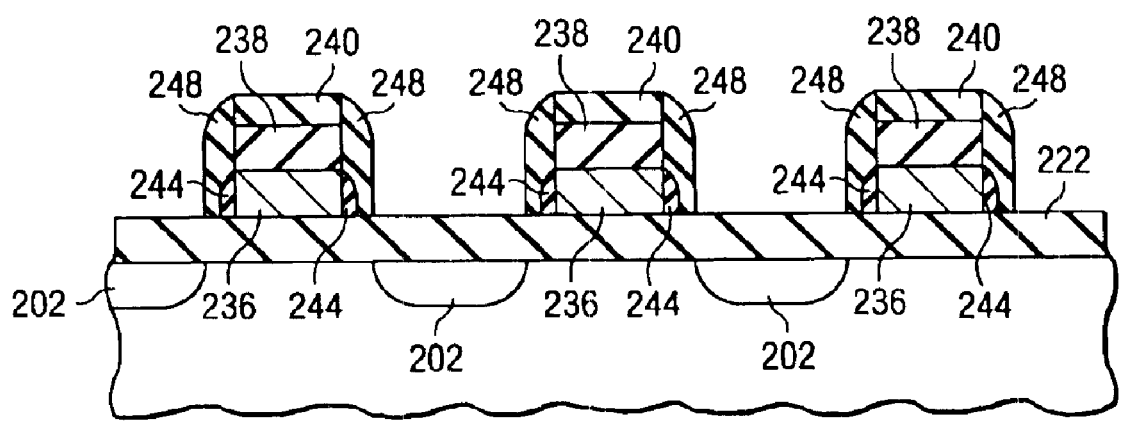

The insulating layer 246 is etched, preferably using an anisotropic etch process, for example, to remove the insulating layer 246 from the top surface of the second etch selectivity material 240 and from over the top surface of the isolation oxide 222 over the component region 202, as shown in FIG. 7. Sidewall spacers 248 are left residing adjacent the sidewalls of the first etch selectivity material 238, second etch selectivity material 240, and adjacent the thin oxide layer 244 on the sidewalls of the gate conductor material 236. The sidewall spacers 248 comprise a thickness of about 150 to 300 Angstroms, for example.

Figure 8:
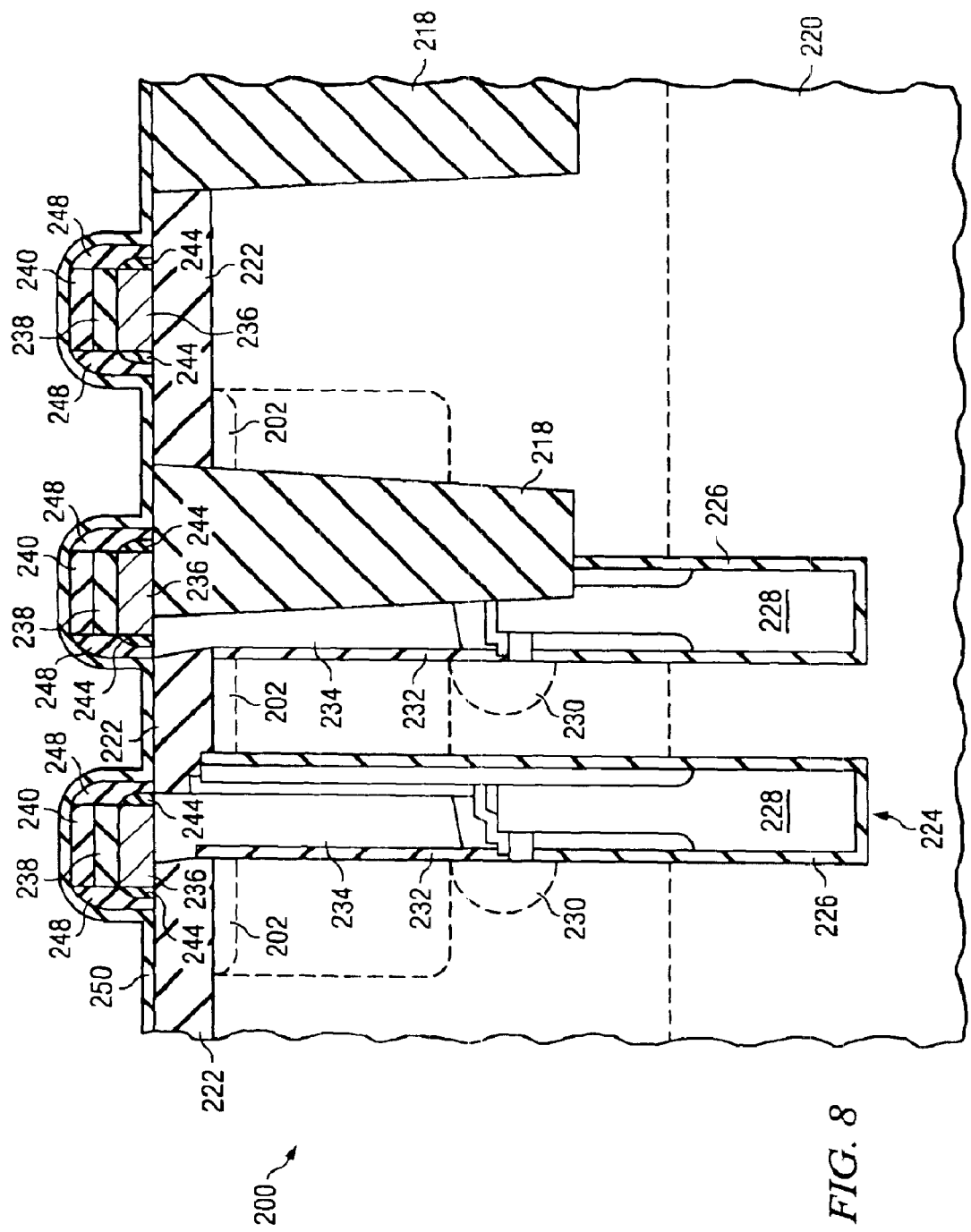

A nitride liner 250 is deposited over the exposed portions of the isolation oxide 222, the sidewall spacers 248, and the top surface of the second etch selectivity material 240, as shown in FIG. 8. The nitride liner 250 preferably comprises silicon nitride and alternatively may comprise other nitride materials deposited in a thickness of about 50 to 200 Angstroms, for example.

Figure 9:
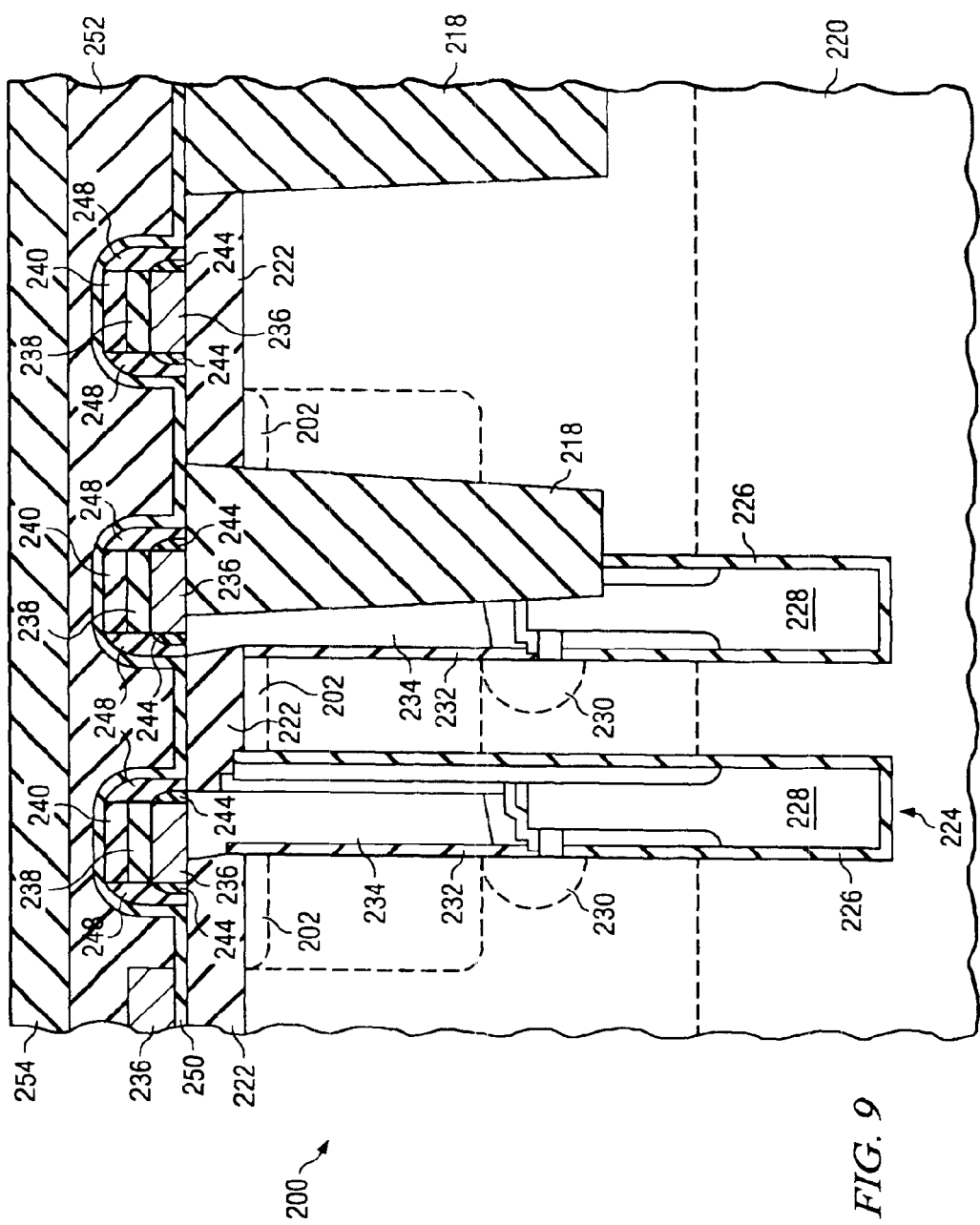

A first insulating layer 252 is deposited over the nitride liner 250, as shown in FIG. 9. The first insulating layer 252 preferably comprises borophosphosilicate glass (BPSG), and may alternatively comprise other insulating materials such as silicon dioxide, for example. The first insulating layer 252 preferably comprises doped oxide, which is deposited and then reflowed by heating the workpiece 220. The first insulating layer 252 preferably entirely fills the space between the patterned wordlines 236, first etch selectivity material 238, and second etch selectivity material 240, and more preferably, extends to a height greater than the top surface of the second etch selectivity material 240, as shown. The first insulating layer 252 may then be polished back to produce a smooth top surface over the first insulating layer 252. Next, a second insulating layer 254 is deposited over the first insulating layer 252. The second insulating layer 254 preferably comprises tetraethoxysilate (TEOS) and may alternatively comprise other insulators, such as fluorinated silicon dioxide or low dielectric constant materials, as examples. The second insulating layer 254 preferably comprises a thickness of between about 1000 to 4000 Angstroms, for example. The second insulating layer 254 may be deposited by CVD or other deposition techniques.

Figure 10:
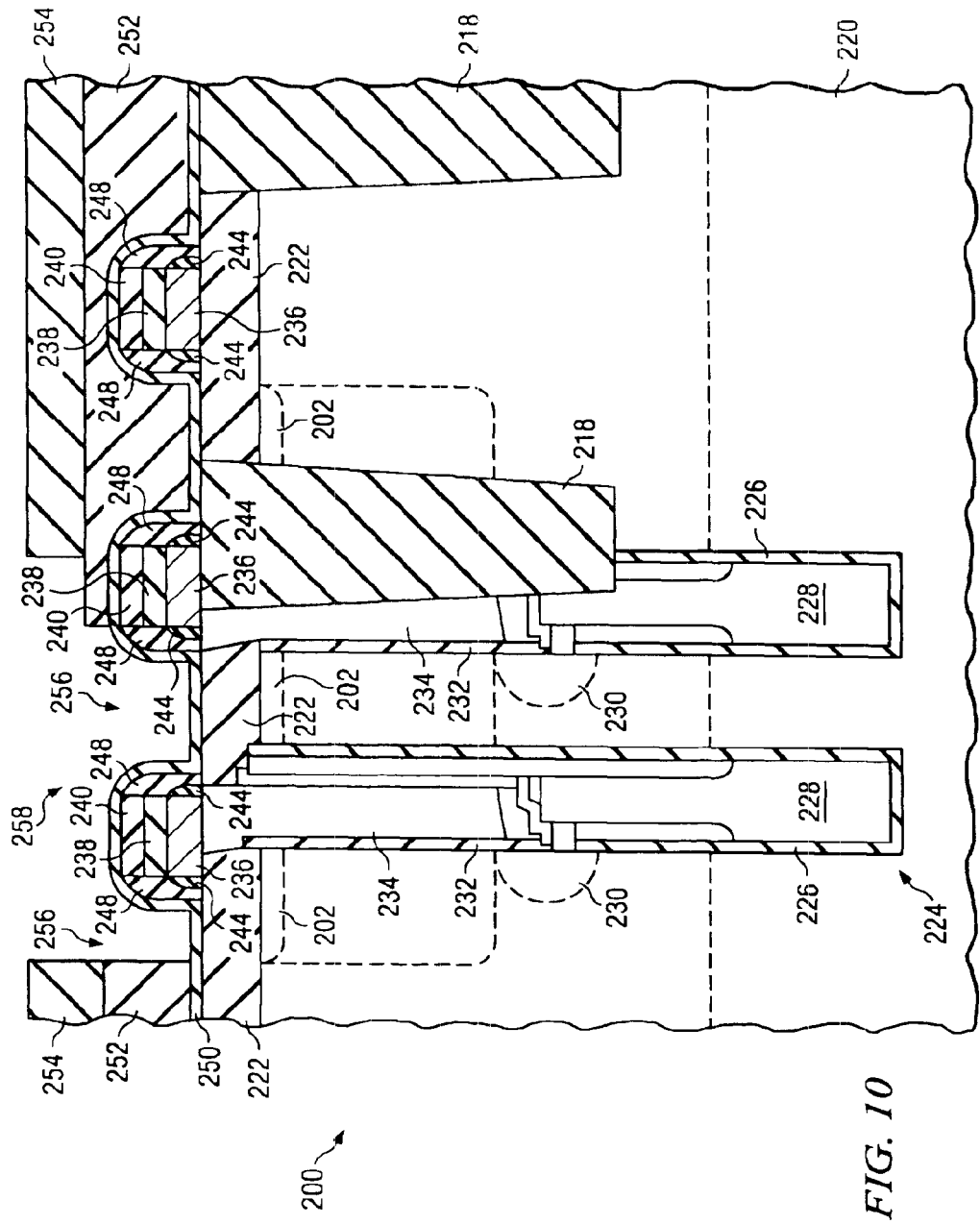

A photoresist (not shown) is deposited over the second insulating layer 254, and the photoresist is patterned with the pattern for bitlines that run in a direction different from the wordline 236 direction. The pattern from the photoresist is transferred to the second insulating layer 254 and first insulating layer 252, for example, by etching the insulating layer 252/254 using the photoresist as a mask, as shown in FIG. 10, forming the pattern 258 for the bitlines. The etch chemistry for etching the first and second insulating layers 252 and 254 may comprise $C_4F_8$, $CH_2F_2$, Ar and/or combinations thereof, as an example, although other etch chemistries may alternatively be used. The photoresist may then be removed, or may be consumed in the pattern transfer step.

In one preferred embodiment, a separate mask and patterning step is not required to form the borderless contacts. Rather, the pattern 256 for the borderless contacts is formed due to the fact that the borderless contacts will be formed immediately beneath the bitline pattern 258 between the patterned wordlines 236, first etch selectivity material 238, and second etch selectivity material 240. In another embodiment, a separate mask (not shown) may be used to pattern the borderless contacts. In either embodiment, the borderless contact allows the density of the memory cells and contacts to be increased.

Note that in FIGS. 10–13, the pattern 258 for only one bitline is shown; however, there may be a plurality of bitline patterns 258 formed elsewhere on the workpiece 220 in locations of the memory cell array extending into and out of the page, for example. Typically in a memory cell array, for example, there are hundreds or thousands of parallel bitlines and wordlines.

Figure 11:
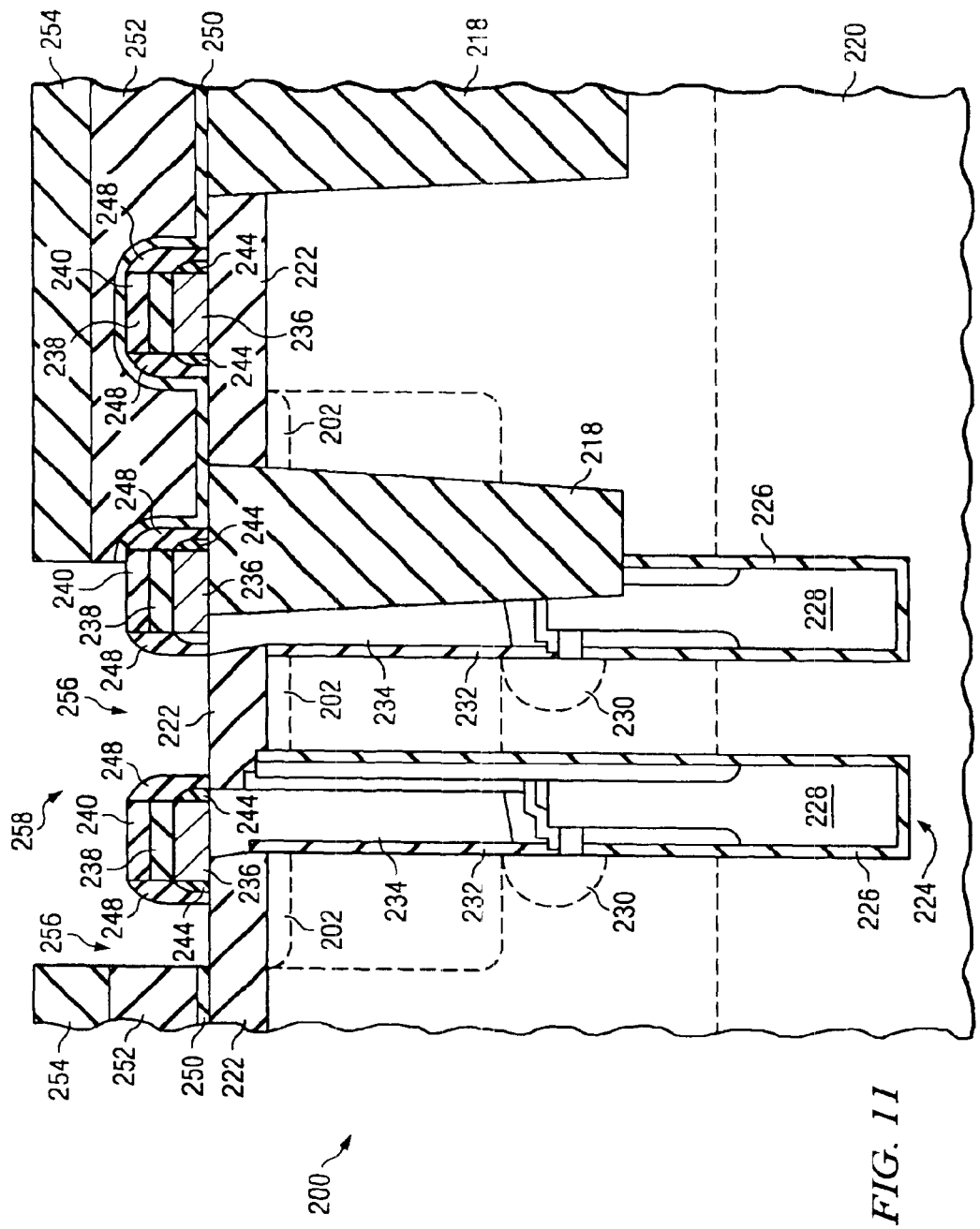

The nitride liner 246 remains residing over the isolation oxide 222 and top surface of the second etch selectivity material 240 at this point of the process flow. However, the top corner edges of the nitride liner 250 may be partially removed during the etch process of the first insulating layer 252 and the second insulating layer 254, not shown. The nitride liner 250 is next exposed to an etch process to remove the nitride liner 250 from at least the top surface of the second etch selectivity material 240 and from over the top surface of the isolation oxide 222, as shown in FIG. 11. The nitride liner 250 etch may comprise an anisotropic etch, in one embodiment of the invention, for example. The etch chemistry for etching the nitride liner 250 may comprise an etch that etches nitride selective to oxide, such as $CH_3F$, $CHF_3$, $CO_2$, $O_2$ and/or combinations thereof, and may alternatively comprise other etch chemistries, as examples.

Figure 12:
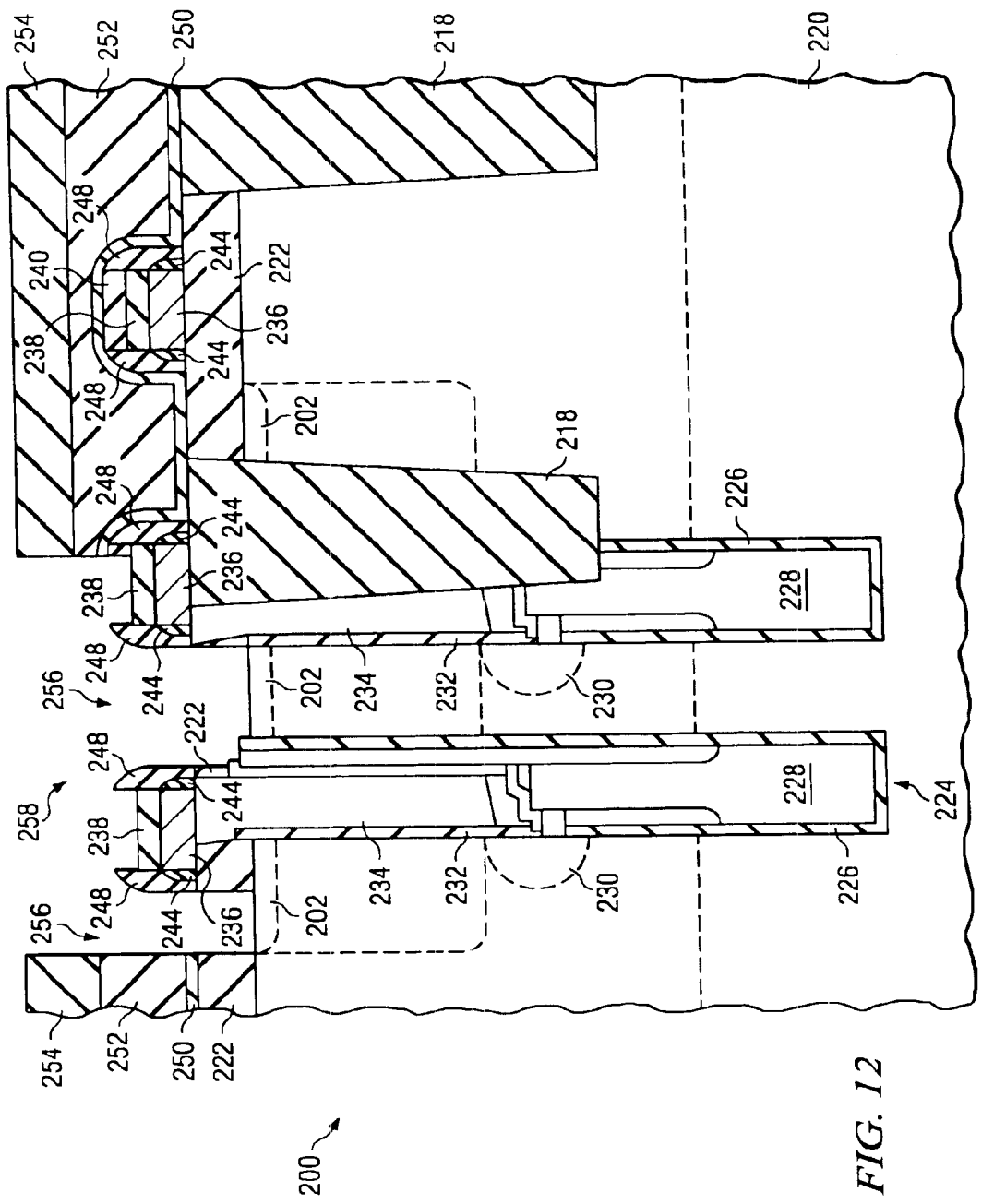

Next, the workpiece 220 is exposed to an oxide etch selective to the material of the first etch selectivity material 238 in order to remove the isolation oxide 222 from over the component regions 202. For example, if the first etch selectivity material 238 comprises a nitride, then an etch selective to nitride is used. This selective etch process may also remove at least a portion of the second etch selectivity material 240 from over the top surface of the first etch selectivity material 238, as shown in FIG. 12. The etch chemistry for etching isolation oxide 222 may comprise $C_4F_8$, CO, Ar and/or combinations thereof, as an example, although other etch chemistries may alternatively be used.

Advantageously, because of the presence of the second etch selectivity material 240, the first etch selectivity material 238 is prevented from being etched or removed during the process of opening the region of the workpiece 220 over the top surface of the component region 202 (by removing the isolation oxide 222, nitride liner 250 and first and second insulating layers 252 and 254) to make electrical contact with borderless contacts. Note that a small top portion of the sidewall spacers 248 may reside above the top surface of the first etch selectivity material 238, after the etch process to remove the isolation oxide 222 and second etch selectivity material 240 described herein. The process flow may include an optional final non-selective etch process to remove any residuals such as nitrides or oxides prior to depositing a conductive material, to ensure good contact between the borderless contact and the component region of the workpiece.

Figure 13:
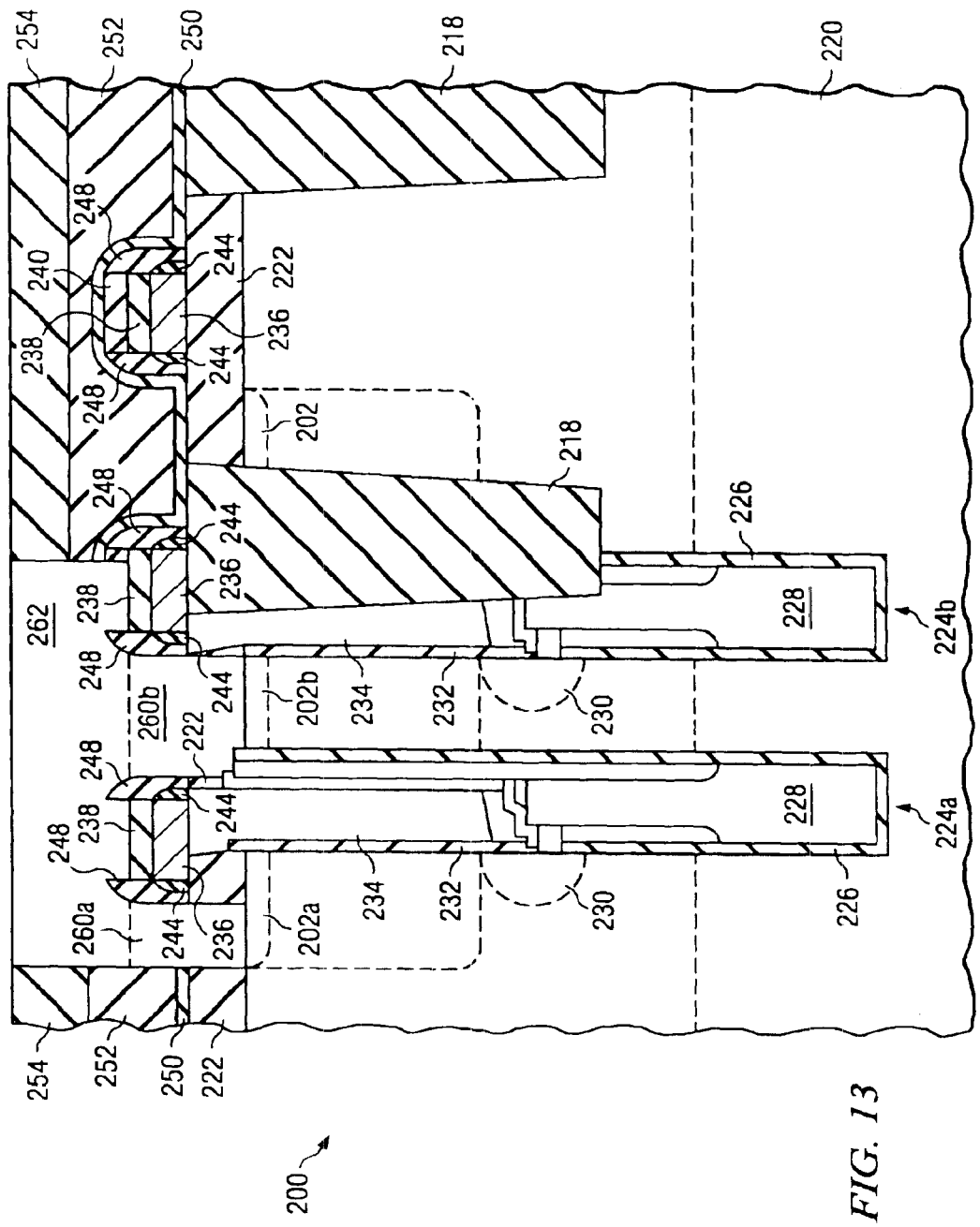

Next, a conductive material is deposited over the second insulating layer 254 in order to fill the patterns 256 and 258 for the bitlines and borderless contacts, respectively, as shown in FIG. 13. The excess conductive material is removed from the top surface of the second insulating layer 254, for example, using a chemical mechanical polish (CMP). Borderless contacts 260a and 260b are formed during the damascene fill process beneath the bitlines 262 that are also formed. The borderless contacts 260a and 260b make electrical contact with and directly abut the component regions 202a and 202b, respectively. In one embodiment, the component regions 202a and 202b may comprise memory cells, and in another embodiment, the component regions 202a and 202b comprise the source or drain of an access transistor for storage capacitors 224a and 224b of memory cells, respectively.

Processing of the semiconductor device 200 is then continued to complete the structure. Note that there may be other processes or steps included in the process flow that have not been described herein because they are not directed to the present invention. For example, the component region 202 may be doped at one or more stages of manufacturing, e.g., a light doping prior to the sidewall spacer 248 formation, and then a heavier doping after the sidewall spacer 248 formation, to improve electrical contact to the subsequently formed borderless contacts 260a and 260b.

The first etch selectivity material 238 has been described as a nitride, and the second etch selectivity material 240 has been described as an oxide, herein. However, alternatively, the first etch selectivity material 238 may comprise an oxide, and the second etch selectivity material 240 may comprise a nitride. In preferred embodiments of the present invention, the first and selectivity materials 238 and 240 comprise materials having different etch selectivities.

Embodiments of the present invention achieve technical advantages as a method of forming borderless contacts 260a and 260b and structure for same in which the first etch selectivity material 238 is preserved and not removed during the etch processes to open the various material layers, e.g., second insulating layer 254, first insulating layer 252, nitride liner 250 and isolation oxide 222, from over the component regions 202a and 202b. Because the first etch selectivity material 238 is not removed and remains in place, shorting of the wordlines 236 to subsequently formed bitlines 262 is prevented, in accordance with embodiments of the present invention. Therefore, embodiments of the present invention result in fewer device failures and improved yields.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a borderless contact, the method comprising:
   providing a workpiece, the workpiece having at least one component region and a first insulating layer formed over the at least one component region;
   depositing a first conductive material over the workpiece;
   depositing a first etch selectivity material over the first conductive material;
   depositing a second etch selectivity material over the first etch selectivity material;
   etching the second etch selectivity material, the first etch selectivity material and the first conductive material to form a plurality of first conductive lines, the second etch selectivity material, first etch selectivity material and first conductive lines comprising sidewalls, the second etch selectivity material comprising a top surface;
   forming sidewall spacers on the sidewalls of the second etch selectivity material, first etch selectivity material and first conductive lines;
   depositing a liner over exposed portions of the workpiece, the sidewall spacers and the second etch selectivity material top surface;
   depositing a second insulating layer over the liner to a height greater than the top surface of the second etch selectivity material;
   patterning the second insulating layer with a pattern for a plurality of second conductive lines, the second conductive lines being positioned in a different direction than the first conductive lines;
   removing the liner from at least over the component region;
   removing the first insulating layer from over the component region; and
   depositing a second conductive material over the second insulating layer to fill the pattern for the plurality of second conductive lines, forming a plurality of second conductive lines and a borderless contact beneath at least one second conductive line abutting the at least one component region.

2. The method according to claim 1, wherein removing the first insulating layer from over the component region comprises an etch process selective to the first etch selectivity material, wherein removing the first insulating layer further comprises removing the second etch selectivity material.

3. The method according to claim 1, wherein depositing the first etch selectivity material comprises depositing a nitride or silicon oxycarbide.

4. The method according to claim 3, wherein depositing the first etch selectivity material comprises depositing silicon nitride.

5. The method according to claim 1, wherein depositing the second etch selectivity material comprises depositing an oxide or silicon oxycarbide.

6. The method according to claim 5, wherein depositing the second etch selectivity material comprises depositing silicon dioxide.

7. The method according to claim 1, wherein forming sidewall spacers comprises:
   depositing an insulating material with the same etch selectivity as the first etch selectivity material over the second etch selectivity material and exposed portions of the workpiece; and
   anisotropically etching the insulating material.

8. The method according to claim 7, wherein depositing the insulating material comprises depositing silicon nitride.

9. The method according to claim 1, wherein depositing the first conductive material comprises depositing a silicide.

10. The method according to claim 1, further comprising forming a thin oxide layer over the sidewalls of the first conductive lines, prior to forming the sidewall spacers.

11. The method according to claim 1, wherein depositing the first insulating layer comprises depositing a layer of borophosphosilicate glass (BPSG) over the liner and depositing a layer of tetraethoxysilate (TEOS) over the BPSG glass layer.

12. The method according to claim 1, wherein depositing the liner comprises depositing silicon nitride.

13. The method according to claim 1, wherein the at least one component region comprises a memory cell.

14. The method according to claim 1, wherein the at least one component region comprises an access transistor for a memory cell.

15. A method of manufacturing a semiconductor device, the method comprising:
   providing a workpiece, the workpiece having a plurality of component regions and a first insulating layer formed over the component regions;
   depositing a first conductive material over the workpiece;
   depositing a first etch selectivity material over the first conductive material;
   depositing a second etch selectivity material over the first etch selectivity material;
   etching the second etch selectivity material, the first etch selectivity material and the first conductive material to form a plurality of first conductive lines, the second etch selectivity material, first etch selectivity material and first conductive lines comprising sidewalls, the second etch selectivity material comprising a top surface;
   depositing a second insulating layer having the same etch selectivity as the first etch selectivity material over the second etch selectivity material and exposed portions of the workpiece;
   anisotropically etching the second insulating layer to form sidewall spacers on the sidewalls of the second etch selectivity material, first etch selectivity material and first conductive lines;
   depositing a nitride liner over exposed portions of the workpiece, the sidewall spacers and the second etch selectivity material top surface;

depositing a third insulating layer over the nitride liner to a height greater than the top surface of the second etch selectivity material;

patterning the third insulating layer with a pattern for a plurality of second conductive lines, the second conductive lines being positioned in a different direction than the first conductive lines;

removing the nitride liner from the component regions;

removing the first insulating layer from over the component region using an etch process selective to the first etch selectivity material, also removing a portion of the second etch selectivity material; and depositing a second conductive material over the second insulating layer to fill the pattern for the plurality of second conductive lines, forming a plurality of second conductive lines and a borderless contact beneath at least one second conductive line abutting the at least one component region.

16. The method according to claim 15, wherein depositing the first etch selectivity material comprises depositing a nitride or silicon oxycarbide.

17. The method according to claim 16, wherein depositing the first etch selectivity material comprises depositing silicon nitride.

18. The method according to claim 15, wherein depositing the second etch selectivity material comprises depositing an oxide or silicon oxycarbide.

19. The method according to claim 18, wherein depositing the second etch selectivity material comprises depositing silicon dioxide.

20. The method according to claim 15, wherein depositing the second insulating layer comprises depositing silicon nitride.

21. The method according to claim 15, wherein depositing the first conductive material comprises depositing a silicide.

22. The method according to claim 15, further comprising forming a thin oxide layer over the sidewalls of the first conductive lines, prior to forming the sidewall spacers.

23. The method according to claim 15, wherein depositing the third insulating layer comprises depositing a layer of borophosphosilicate glass (BPSG) over the liner and depositing a layer of tetraethoxysilate (TEOS) over the BPSG glass layer.

24. The method according to claim 15, wherein the component regions comprise memory cells.

25. The method according to claim 15, wherein the component regions comprise access transistors for memory cells.

* * * * *